(12) United States Patent
Atsuki et al.

(10) Patent No.: US 7,628,840 B2
(45) Date of Patent: Dec. 8, 2009

(54) METAL NANO-PARTICLES AND METHOD FOR PREPARING THE SAME, DISPERSION OF METAL NANO-PARTICLES AND METHOD FOR PREPARING THE SAME, AND THIN METALLIC WIRE AND METAL FILM AND METHOD FOR PREPARING THESE SUBSTANCES

(75) Inventors: Tsutomu Atsuki, Chiba-ken (JP); Masaaki Oda, Chiba-ken (JP); Toshiharu Hayashi, Ibaraki-ken (JP); Reiko Kiyoshima, Ibaraki-ken (JP)

(73) Assignees: ULVAC, Inc., Kanagawa (JP); JEMCO, Inc., Akita (JP)

( * ) Notice: Subject to any disclaimer, the term of this patent is extended or adjusted under 35 U.S.C. 154(b) by 321 days.

(21) Appl. No.: 10/571,315

(22) PCT Filed: Sep. 7, 2004

(86) PCT No.: PCT/JP2004/012968

§ 371 (c)(1),
(2), (4) Date: Oct. 13, 2006

(87) PCT Pub. No.: WO2005/023702

PCT Pub. Date: Mar. 17, 2005

(65) Prior Publication Data

US 2007/0134491 A1 Jun. 14, 2007

(30) Foreign Application Priority Data

Sep. 9, 2003 (JP) ............................. 2003-317161

(51) Int. Cl.
*B22F 9/18* (2006.01)
*B22F 9/24* (2006.01)
*B22F 9/26* (2006.01)
*B05D 3/02* (2006.01)

(52) U.S. Cl. ............................. 75/717; 75/331; 75/343; 75/362; 75/392; 75/721; 427/191; 427/201; 428/402; 428/570

(58) Field of Classification Search ................. 428/403, 428/407, 570, 323; 75/331, 343, 362, 392, 75/413, 717, 721; 427/191, 201

See application file for complete search history.

(56) References Cited

U.S. PATENT DOCUMENTS

| | | | | |
|---|---|---|---|---|
| 5,250,101 | A * | 10/1993 | Hidaka et al. | 75/362 |
| 6,103,868 | A * | 8/2000 | Heath et al. | 528/482 |
| 6,346,136 | B1 * | 2/2002 | Chen et al. | 75/343 |
| 6,358,611 | B1 * | 3/2002 | Nagasawa et al. | 428/403 |
| 6,730,400 | B1 * | 5/2004 | Komatsu et al. | 428/403 |
| 6,974,493 | B2 * | 12/2005 | Harutyunyan et al. | 75/362 |
| 7,066,978 | B2 * | 6/2006 | Waki et al. | 75/348 |
| 7,081,214 | B2 * | 7/2006 | Matsuba et al. | 252/512 |
| 7,160,525 | B1 * | 1/2007 | Peng et al. | 423/1 |
| 7,335,245 | B2 * | 2/2008 | He et al. | 75/351 |
| 7,407,527 | B2 * | 8/2008 | Hyeon | 75/351 |
| 2006/0070493 | A1 * | 4/2006 | Hirakoso et al. | 75/255 |

FOREIGN PATENT DOCUMENTS

| | | |
|---|---|---|
| JP | 10-183207 | 7/1998 |
| JP | 11-319538 | 11/1999 |
| JP | 2002-121606 | 4/2002 |
| JP | 2002-245854 | 8/2002 |
| JP | 2002-317215 | 10/2002 |
| WO | 00/76699 A1 | 12/2000 |

OTHER PUBLICATIONS

Sylvia Gomez et al., "Gold nanoparticles from self-assembled gold(I) amine precursors," No. 19, 2000, pp. 1945-1946.

* cited by examiner

*Primary Examiner*—H. (Holly) T Le
(74) *Attorney, Agent, or Firm*—Arent Fox LLP

(57) ABSTRACT

Each of the metal nano-particles present in a dispersion, which comprises at least one metal selected from the group consisting of precious metals and transition metals or an alloy of at least two metals selected from the foregoing metals, comprises a metal particle in which an organic metal compound of a fatty acid and/or an amine-metal complex is adhered to the periphery of the metal particle. This organic metal compound and the amine-metal complex are admixed together in a solvent and then the resulting mixture is subjected to a reducing treatment to thus form a dispersion containing metal nano-particles in a concentration of not less than 5% by mass and not more than 90% by mass. The resulting dispersion is applied onto the surface of a base material, followed by drying the applied layer of the dispersion and then firing the dried layer of the dispersion at a low temperature to thus form a thin metallic wire or a metal film having conductivity.

16 Claims, 1 Drawing Sheet

METAL NANO-PARTICLES AND METHOD FOR PREPARING THE SAME, DISPERSION OF METAL NANO-PARTICLES AND METHOD FOR PREPARING THE SAME, AND THIN METALLIC WIRE AND METAL FILM AND METHOD FOR PREPARING THESE SUBSTANCES

CROSS-REFERENCE TO RELATED APPLICATION

This application is a National Stage entry of International Application Number PCT/JP2004/012968, filed Sep. 7, 2004. The disclosure of the prior application is hereby incorporated herein in its entirety by reference.

TECHNICAL FIELD

The present invention relates to metal nano-particles and a method for the preparation of the metal nano-particles; a dispersion of such metal nano-particles and a method for the preparation of the dispersion; and a thin metallic wire and a metal film as well as a method for the preparation of these wire and film.

BACKGROUND ART

As a conventional method for the preparation of conductive metal nano-particles consisting of metal nano-particles having a particle size of not more than 100 nm, there has been known, for instance, a method comprising the step of reducing ions of a precious metal or copper to thus form a colloidal dispersion of the precious metal or copper (see, for instance, Patent Article 1 specified later). There has also been known a metal colloidal dispersion containing a compound having at least one amino group and at least one carboxyl group (see, for instance, Patent Article 2 specified below). In either of these methods, however, it has been quite difficult to prepare a stable metal colloid dispersion having a high concentration.

Patent Article 1: Japanese Un-Examined Patent Publication Hei 11-319538 (refer to Claims);

Patent Article 2: Japanese Un-Examined Patent Publication 2002-245854 (refer to Claims).

DISCLOSURE OF THE INVENTION

Problems that the Invention is to Solve

In the method for forming metal wires used in the fields of electric and electronic industries, the temperature used has gradually been reduced to a level of as low as possible. Moreover, there have been used a variety of substances such as glass and polyimides as a basic substrate material onto which metal nano-particles are applied and the resulting nano-article-containing layer is thereafter dried and then fired. In addition to these base materials, metal nano-particles have recently been applied frequently onto a substrate comprising glass on which a TFT (thin film transistor) has been mounted and the further reduction of the film-forming temperature has likewise been required in this case. It has likewise been required that the firing temperature should be reduced to a level as low as 200° C. although it may vary depending on the quality of each particular base material.

Under such circumstances, there has strongly been desired for the development of a technique which permits the formation of metal wires having a desired thickness while using a low firing temperature and reducing the number of coating operations and the number of film-forming steps to the smallest possible level. To this end, there has been desired for the development of a technique for obtaining dispersed metal nano-particles which permit the formation of metal wires having a low resistivity even by the low temperature firing technique and which have a high metal concentration. In the conventional methods for the preparation of a film comprising metal nano-particles used in such applications, a variety of problems arise such that the methods should include a high temperature firing step although they can form, for instance, a fired film having a low resistance and that these methods require the use of an increased number of coating steps for forming such a film although they can include a low temperature firing step. On the contrary, even if the concentration of the solid contents present in a coating liquid is increased through any means in order to reduce the number of coating step, other problems arise such that the resulting liquid becomes unstable and that metal particles undergo secondary aggregation and this in turn results in the sedimentation of the particles.

Accordingly, it is an object of the present invention to solve the foregoing problems associated with the conventional techniques and more specifically to provide metal nano-particles which may be stable to such an extent that the concentration of metal solid contents present in a coating liquid can be increased to a considerable level, which can thus reduce the number of coating steps or the number of film-forming steps and, at the same time, which can form a film having a sufficient conductivity even by the firing step carried out at a low temperature and a method for the preparation thereof; a dispersion of such metal nano-particles and a method for the preparation of the same; and a thin metallic wire and a metal film prepared using the foregoing dispersion as well as a method for the preparation of these wire and film.

Means for the Solution of the Problems

According to an aspect of the present invention, there is provided metal nano-particles, which are characterized in that an organic metal compound is adhered to the periphery of each metal particle as a dispersant.

According to the metal nano-particles of the present invention, the organic metal compound comprises at least one metal selected from the group consisting of precious metals and transition metals or it comprises an alloy of at least two metals selected from the foregoing group of metals.

According to the metal nano-particles of the present invention, the organic metal compound is an organic metal compound of a fatty acid, a metal complex of an amine or a mixture of an organic metal compound of a fatty acid and a metal complex of an amine.

According to the metal nano-particles of the present invention, the foregoing fatty acid is at least one member selected from the group consisting of $C_6$ to $C_{22}$ saturated fatty acids and unsaturated fatty acids, each having a linear or branched structure and the fatty acid is, for instance, at least one member selected from the group consisting of hexanoic acid, heptanoic acid, octanoic acid, nonanoic acid, decanoic acid, undecanoic acid, dodecanoic acid, tetra-decanoic acid, eicosanoic acid, docosanoic acid, 2-ethyl hexanoic acid, oleic acid, linoleic acid and linolenic acid.

According to the metal nano-particles of the present invention, the foregoing amine is a $C_6$ to $C_{13}$ aliphatic amine having a linear or branched structure and the amine is, for instance, at least one member selected from the group consisting of hexylamine, heptylamine, octylamine, decylamine, dodecylamine, 2-ethyl-hexylamine, 1,3-dimethyl-n-butylamine, 1-amino-undecane and 1-amino-tridecane.

According to another aspect of the present invention, there is provided a method for preparing metal nano-particles of the present invention, which comprises the steps of dissolving, in a non-polar solvent, an organic metal compound of the foregoing fatty acid, a metal complex of the foregoing amine or a mixture of the organic metal compound and the metal complex and adding a reducing agent to the resulting liquid to subject the liquid to a reducing treatment and to thus give metal nano-particles.

According to foregoing production method of the present invention, the reducing treatment of the liquid is carried out while introducing, into the liquid, hydrogen gas, carbon monoxide gas, a hydrogen-containing gas or a carbon monoxide-containing gas.

According to the foregoing production method of the present invention, after the completion of the reducing treatment, deionized water is added to the liquid, followed by stirring and then allowing the liquid to stand so that impurities present in the liquid are transferred to the polar solvent and that the impurity concentration in the non-polar solvent is thus reduced.

According to still another aspect of the present invention, there is provided a metal nano-particle-containing dispersion, which is characterized in that the metal nano-particle concentration thereof is controlled to a level of not less than 5% by mass and not more than 90% by mass and obtained by the concentration of the dispersion containing the metal nano-particles prepared according to the foregoing preparation method and the subsequent re-dispersion of the metal nano-particles.

According to a further aspect of the present invention, there is provided a method for the preparation of a metal nano-particle-containing dispersion, which is characterized in that it comprises the steps of concentrating the dispersion containing the metal nano-particles prepared according to the foregoing preparation method and then again dispersing the metal nano-particles to thus give a dispersion having a metal nano-particle concentration of not less than 5% by mass and not more than 90% by mass.

According to the foregoing metal nano-particle-containing dispersion, the size of the foregoing metal nano-particles is not less than 1 nm and not more than 100 nm.

According to a still further aspect of the present invention, there is provided a method for the preparation of a thin metallic wire or a metal film, which comprises the steps of coating, onto the surface of a base material, a dispersion containing the foregoing metal nano-particle, a dispersion containing the metal nano-particle prepared according to the foregoing method, the foregoing dispersion or the foregoing metal nano-particle-containing dispersion prepared according to the foregoing method, followed by drying and then firing the coated layer of the dispersion to thus form a thin metallic wire or a metal film having conductivity.

According to the present invention, there is provided a thin metallic wire or a metal film, which is prepared according to the foregoing method.

According to the present invention, the temperature of the foregoing firing step ranges from 140 to 300° C. and preferably 140 to 220° C.

EFFECTS OF THE INVENTION

The present invention permits the formation of a stable dispersion containing metal nano-particles in a high concentration, this in turn leads to the considerable reduction of the number of coating operations and/or the number of film-forming steps required for the production of, for instance, a thin metallic wire or a metal film having high conductivity and the present invention further permits the formation of such articles having practically acceptable conductivity even when the coated layer is fired at such a low temperature on the order of about 220° C.

BEST MODE FOR CARRYING OUT THE INVENTION

The metal as a constituent of the metal nano-particles of the present invention is one member or at least two members selected from the group consisting of, for instance, Ag, Au, Cu, Pt, Pd, W, Ni, Ta, In, Sn, Zn, Cr, Fe, Co and Si, or an alloy of at least two metals selected from the foregoing group of metals and the metal may arbitrarily be selected depending on each particular purpose and/or application. Among these metals, preferably used herein is at least one member selected from the group consisting of precious metals such as Ag and Au, and Cu, or an alloy containing at least two of these metals. Elements, which are originated from reducing agents, such as B, N, P and the like, may be mixed. The metal nano-particles of the present invention which are constituted by the foregoing metals have a structure in which an organic metal compound is adhered to the periphery of each metal particle as a dispersant. The term "adhesion" used herein means that an organic metal compound or a metal-amine complex is adsorbed on the surface of each metal particle through metal ions and accordingly, these metal particles are in such a state that the foregoing structure assists the stable dispersion thereof in an organic medium.

The fatty acid moieties each constituting the organic metal compound of a fatty acid used as the foregoing organic metal compound is at least one member selected from the group consisting of $C_6$ to $C_{22}$ saturated fatty acids and unsaturated fatty acids and it is preferred that the fatty acid is, for instance, at least one fatty acid selected from the group consisting of hexanoic acid, heptanoic acid, octanoic acid, nonanoic acid, decanoic acid, undecanoic acid, dodecanoic acid, tetra-decanoic acid, eicosanoic acid, docosanoic acid, 2-ethyl hexanoic acid, oleic acid, linoleic acid and linolenic acid.

Moreover, the amine moieties constituting the metal complex of an amine used herein as the organic metal compound may be, for instance, at least one member selected from the group consisting of alkylamines.

The alkylamine usable in the present invention is not restricted to any particular one and it may, for instance, be a primary, secondary or tertiary amine, a monoamine, or a polyvalent or higher amine such as a diamine or a triamine. In particular, preferably used herein include alkylamines having a principal skeleton whose carbon atom number ranges from 4 to 20 and more preferably used herein include alkylamines whose principal skeleton has 8 to 18 carbon atoms because of their stability and handling characteristics. Moreover, All of the alkylamines or primary, secondary and tertiary alkylamines may be effective as the dispersants usable herein, but preferably used herein include primary alkylamines because of their stability and handling characteristics. In this regard, if the alkylamine has the number of carbon atoms smaller than 4, a problem arises such that the amine has an extremely high basicity, the amine would be liable to corrode the metal nano-particles and it would finally dissolve the nano-particles. On the other hand, if the main chain or principal skeleton of alkylamine has the number of carbon atoms higher than 20, a problem arises such that, when the concentration of the metal nano-particles in the resulting dispersion is increased, the resulting metal nano-particle-containing dispersion has a high or increased viscosity, the handling characteristics of the dispersion is in turn deteriorated and carbon atoms would often remain within the thin metallic wires or films obtained after firing the coated layer of the dispersion and this in turn leads to an increase in the specific resistance.

Specific examples of such alkylamines which can be used in the present invention are primary amines such as butylamine, hexylamine, octylamine, nonyl-amine, dodecylamine, hexadodecylamine, octadecylamine, cocoamine, tallowamine, hydrogenated tallowamine, oleylamine, laurylamine and stearylamine; secondary amines such as di-cocoamine, di-hydrogenated tallowamine and di-stearylamine; and tertiary amines such as dodecyl dimethyl-amine, di-dodecyl monomethyl-amine, tetradecyl dimethyl-amine, octadecyl dimethyl-amine, coco-dimethyl-amine, dodecyl tetradecyl dimethyl-amine and tri-octylamine; as well as diamines such as naphthalene-diamine, stearyl-propylene diamine, octamethylene diamine, and nonane diamine. Among these amines, preferably used herein are hexylamine, heptylamine, octylamine, decylamine, dodecylamine, 2-ethylhexylamine, 1,3-di-methyl-n-butylamine, 1-aminoundecane, and 1-aminotridecane.

According to the present invention, the content of the alkylamine present in the metal nano-particle-containing dispersion is not less than 0.1% by mass and not more than 10% by mass and desirably not less than 1% by mass and not more than 5% by mass. If the content thereof is less than 0.1% by mass, molecules of a metal compound of a fatty acid are mutually linked together to thus show a viscosity-increasing effect, this in turn impairs the dispersibility of the particles after the reduction thereof. If it exceeds 10% by mass, an effect is induced, which is due to the formation of strong linkages between nitrogen atoms and the metallic moieties of the particles, and thus nitrogen atoms cannot completely be eliminated even through the firing/pyrolytic decomposition process and the strong linkage effect would obstruct the achievement of the desired low temperature firing characteristics.

According to the present invention, the foregoing organic metal compound may be a mixture containing an organic metal compound of a fatty acid with an amine-metal complex in any mixing ratio.

According to the method for preparing the metal nano-particles of the present invention, an organic metal compound of a fatty acid and/or an amine-metal complex are dissolved in a polar solvent, followed by the addition of a reducing agent for practicing the reducing treatment of the resulting liquid to thus give metal nano-particles.

As the foregoing reducing agents, it is preferred to use, for instance, sodium boron hydride, dimethylamine borane and tert-butylamine borane. The reducing agent usable herein is not restricted to these particular ones specified above and may be any known one inasmuch as it can show the same reducing effect. This reducing reaction is preferably carried out while introducing hydrogen gas, carbon monoxide gas, a hydrogen-containing gas and/or a carbon monoxide-containing gas into the reaction system.

The foregoing reducing treatment is carried out at room temperature or under such conditions as the refluxing with heating while blowing the foregoing gas or gases through the reaction system during stirring operations.

As has been discussed above, in the present invention, the foregoing solution in a non-polar solvent is subjected to a reducing treatment to form a metal colloid, but impurities (such as boron atoms originated from the reducing agent used) are present in the reaction liquid. For this reason, deionized water is added to the reaction liquid, and the resulting mixture is allowed to stand over a desired period of time after stirring the same and only the resulting supernatant is finally recovered. At this stage, among the impurities present in the reaction liquid, the hydrophilic ones are transferred to the aqueous phase and therefore, the removal thereof would permit the substantial reduction of the content of such impurities. In this respect, it is also possible to use a polar solvent having the small number of carbon atoms in place of the foregoing deionized water. Moreover, after the removal of, for instance, the excess fatty acid, fatty acid esters and amines present in the reaction liquid, the reaction liquid may be concentrated through the filtration thereof according to, for instance, the ultrafiltration for improving the purity of the reaction liquid and for increasing the metal concentration thereof and as a result, there can thus be obtained a dispersion containing metal nano-particles in a concentration of not less than 5% by mass and not more than 90% by mass.

According to the present invention, in the case of the metal nano-particle-containing dispersion prepared by the foregoing method, the dispersion never undergoes any agglomeration of these nano-particles even at a high concentration on the order of 90% by mass and it never loses its fluidity. Such a metal nano-particle-containing dispersion having a concentration of 90% by mass is used for the formation of multi-layered metal wires used in, for instance, IC substrates or internal metal wires for IC. In this case, the dispersion never loses its fluidity and it never undergoes any agglomeration of nano-particles included therein. Accordingly, the dispersion permits the formation of fine wiring patterns having uniform conductivity and free of any defect.

The non-polar solvents used in the present invention may be, for instance, weakly polar solvents and it is preferred that the solvents are organic solvents whose principal skeleton has the carbon atom number ranging from 6 to 18. If the number of carbon atoms is less than 6, the polarity of the solvent is too high to ensure dispersion of metal particles or the resulting dispersion is quickly dried and accordingly, the dispersion has insufficient handling characteristics. On the other hand, if the carbon atom number of the principal skeleton exceeds 18, various problems arise such that the resulting dispersion has a higher viscosity and that carbon atoms are liable to remain in the product obtained after firing the dispersion. Examples of such solvents usable herein include long chain alkanes such as hexane, heptane, octane, decane, undecane, dodecane, tridecane and trimethyl pentane; cyclic alkanes such as cyclohexane, cycloheptane and cyclooctane; aromatic hydrocarbons such as benzene, toluene, xylene, trimethyl benzene and dodecyl-benzene; and alcohols such as hexanol, heptanol, octanol, decanol, cyclohexanol and terpineol. These solvents may be used alone or in the form of a mixed solvent containing at least two of them. For instance, mineral spirit may be used as such a solvent, which is a mixture of long chain alkanes.

Moreover, the polar solvent may be one having the small number of carbon atoms and specific examples thereof preferably used herein are methanol, ethanol and acetone.

The metal nano-particles herein provided have a particle size of not more than 100 nm. In the case of multi-layered metal wires used in, for instance, IC substrates or internal metal wires for semiconductors, they have increasingly become finer and finer, recently and there has thus been required for the formation of metal wires each having a width of not more than 1 μm and accordingly, the particle size of the metal nano-particles should be reduced to a level on the order of not more than $1/10$ time of the required width of metal wires or not less than 1 nm and not more than 100 nm and preferably not less than 1 nm and not more than 10 nm. The metal nano-particles according to the present invention completely satisfy this requirement. In addition, the particles having a particle size of greater than 100 nm would undergo a sedimentation phenomenon due to their own weight and accordingly, the presence of such particles never ensures the formation of or never provides a dispersion having any excellent dispersibility.

The method for the formation of a thin metallic wire or a metal film having electric conductivity according to the present invention comprises the steps of applying the foregoing metal nano-particle-containing dispersion onto the surface of a variety of base materials by the use of a coating technique such as the spin-coating method, drying the coated layer of the dispersion and then firing the dried layer. At this stage, the drying temperature may be one which can dry the coated layer to such an extent that the layer is almost free of any fluidity and it is sufficient to use a drying temperature ranging from, for instance, 50 to 100° C. On the other hand, the firing temperature ranges from, for instance, 140 to 300° C. and preferably 140 to 220° C. Thus, there can be prepared a thin metallic wire or a metal film having conductivity sufficient for putting the same into practical use.

EXAMPLE 1

Silver oleate was selected as the organic acid salt component and silver complex of octylamine was selected as the amine complex component. First of all, 28 g of silver oleate and 12 g of silver complex of octylamine were added to a non-polar solvent and a uniform solution was then prepared. Then dimethylamine borane was dissolved in methanol to a final concentration of 10% to give a reducing agent-containing solution, then 0.1 g of this reducing agent-containing solution was added to the foregoing solution containing silver oleate and silver complex of octylamine to thus make these components react with one another. Immediately after the addition of the reducing agent-containing solution, the formation of a metal colloid was confirmed since the reaction solution underwent a color change from transparent to light brown. Impurities such as boron atoms were present in the resulting reaction solution. Accordingly, deionized water was added to the reaction liquid, the resulting mixture was vigorously stirred, followed by allowing the mixture to stand overnight and the subsequent recovery of only the supernatant. Further, the reaction solution was concentrated according to the ultrafiltration technique for the removal of any excess oleic acid and octylamine possibly affecting the thermal decomposition of the reaction solution and then toluene was used as a non-polar solvent for controlling the concentration of the reaction solution to thus give an Ag-containing dispersion having a concentration of 35% by mass. The resulting Ag nano-particles were inspected for the particle size and it was found to be 5 nm.

The resulting dispersion was applied onto the surface of a substrate (a glass substrate) by the spin-coating technique, followed by drying the coated layer at 100° C. and the subsequent firing of the dried layer at 250° C. to thus form a thin film of Ag. The resulting film was inspected for the surface resistance and it (as expressed in terms of the specific resistance thereof) was found to be $3.6 \times 10^{-6}$ Ω·cm at a film thickness of 0.3 μm.

EXAMPLE 2

The same procedures used in Example 1 were repeated except for using silver linoleate as the organic acid salt component and a silver complex of octylamine as the amine complex component to thus form silver nano-particles, to form a film using the silver nano-particles and to evaluate the resulting film. As a result, the resistance value of the resulting film was found to be $3.6 \times 10^{-6}$ Ω·cm at a film thickness of 0.3 μm, as expressed in terms of the specific resistance.

The same procedures used in Example 1 were repeated except for using raw materials specified in the following Table 1 to thus form each corresponding metal nano-particles, to form a film using the metal nano-particles and to evaluate the resulting film.

TABLE 1

| Ex. No. | Organic acid salt component | Amine complex component | Reducing agent | Conc. of Metal (%) | Film Thickness (μm) | Res. value ($\times 10^{-6}$ Ω·cm) |
|---|---|---|---|---|---|---|
| 3 | Decanoic acid Ag | Hexylamine Ag | t-Butylamine borane | 35 | 0.30 | 3.2 |
| 4 | Decenoic acid Ag | Octylamine Ag | Na boron hydride | 35 | 0.35 | 4.8 |
| 5 | Oleic acid Ag | Dodecylamine Ag | Dimethylamine borane | 35 | 0.35 | 4.2 |
| 6 | Heptanoic acid Ag | Heptylamine Ag | Dimethylamine borane | 35 | 0.35 | 3.5 |
| 7 | Octanoic acid Ag | Hexylamine Ag | t-Butylamine borane | 35 | 0.25 | 4.0 |
| 8 | Nonanoic acid Ag | Decylamine Ag | Na boron hydride | 35 | 0.30 | 3.3 |
| 9 | Oleic acid Ag | 2-Ethylhexyl-amine Ag | CO gas | 35 | 0.25 | 3.6 |
| 10 | Decanoic acid Ag | 1-Amino-undecane Ag | $H_2$ gas | 35 | 0.30 | 4.0 |
| 11 | Decenoic acid Ag | Hexylamine Ag | CO + $N_2$ gas | 35 | 0.25 | 3.8 |
| 12 | Linoleic acid Ag | Octylamine Ag | $H_2$ + $N_2$ gas | 35 | 0.25 | 3.5 |
| 13 | Linolenic acid Ag | Heptylamine Ag | t-Butylamine borane | 35 | 0.30 | 3.2 |
| 14 | Hexanoic acid Ag | Hexylamine Ag | Na boron hydride | 35 | 0.30 | 3.8 |
| 15 | Dodecanoic acid Ag | Decylamine Ag | Dimethylamine borane | 35 | 0.25 | 3.5 |
| 16 | Oleic acid Ag | Heptylamine Ag | t-Butylamine borane | 35 | 0.25 | 3.9 |
| 17 | Decanoic acid Au | Hexylamine Au | CO + $N_2$ gas | 35 | 0.30 | 4.0 |
| 18 | Decenoic acid Au | 1-Amino-undecane Au | $H_2$ gas | 35 | 0.25 | 3.4 |
| 19 | Linoleic acid Au | Heptylamine Au | Dimethylamine borane | 35 | 0.25 | 3.6 |

TABLE 1-continued

| Ex. No. | Organic acid salt component | Amine complex component | Reducing agent | Conc. of Metal (%) | Film Thickness (μm) | Res. value (×10$^{-6}$ Ω·cm) |
|---|---|---|---|---|---|---|
| 20 | Linolenic acid Au | Octylamine Au | t-Butylamine borane | 35 | 0.30 | 3.9 |
| 21 | Hexanoic acid Au | Decylamine Au | t-Butylamine borane | 35 | 0.30 | 3.5 |
| 22 | Dodecanoic acid Au | Hexylamine Au | $H_2 + N_2$ gas | 35 | 0.25 | 3.8 |
| 23 | Oleic acid Au | Heptylamine Au | Na boron hydride | 35 | 0.25 | 3.2 |

The silver nano-particles prepared in Example 5 using oleic acid-Ag and dodecylamine-Ag complex was analyzed according to the TOF-SIMS analytical technique and the results thus obtained are depicted on the attached FIG. 1. It was confirmed from these results that oleic acid-Ag (oleic acid+Ag) or dodecylamine-silver (dodecylamine+Ag) was adhered to the surface of the metal particles.

COMPARATIVE EXAMPLE 1

The same procedures used in Example 1 were repeated except for using a 10% aqueous silver nitrate solution, SOL-SPARS 24000 (the trade name of a product available from ZENEKA Company) as a polymer type dispersant and diethanol-amine as a reducing agent to thus form a dispersion containing silver nano-particles. After the completion of the reaction, the concentration of the dispersion was adjusted to a final concentration of 35%.

The resulting dispersion was applied onto the surface of a substrate by the spin-coating technique, followed by drying the coated layer at 100° C. and the subsequent firing of the dried layer at 250° C. to thus form a thin film of Ag. The resulting thin film was inspected for the surface resistance and it (as expressed in terms of the specific resistance thereof) was found to be 7×10$^{-2}$ Ω·cm at a film thickness of 0.3 μm.

COMPARATIVE EXAMPLE 2

There were dissolved 0.44 g of synthetic glycine and 3.2 g of ferrous sulfate heptahydrate in 90 mL of ion-exchanged water, the pH value thereof was controlled to 7 using an aqueous sodium hydroxide solution (having an appropriate concentration, prepared by dissolving sodium hydroxide of special reagent grade available from WAKO Pure Chemical Co., Ltd. in ion-exchanged water) and then ion-exchanged water was added to the aqueous solution so that the total amount of the resulting solution was equal to 128 mL. Then, to the resulting solution, there was dropwise added 2 mL of an aqueous solution containing 1 g of silver nitrate, while stirring the solution using a magnetic stirrer at room temperature to thus prepare a silver colloidal solution having a metal content of about 5 g/L. At this stage, the amount of glycine was set at a level of 0.69 g per 1 g of silver.

The foregoing silver colloidal solution had a low concentration and accordingly, the colloidal solution was subjected to a concentration treatment through the ultrafiltration technique, but the colloidal solution underwent agglomeration during the course of the ultrafiltration. In addition, the film thickness should be increased in order to obtain sufficient conductivity. To this end, the use of the dispersion having such a low concentration required the coating operations over not less than 10 times.

INDUSTRIAL APPLICABILITY

Figure 1:
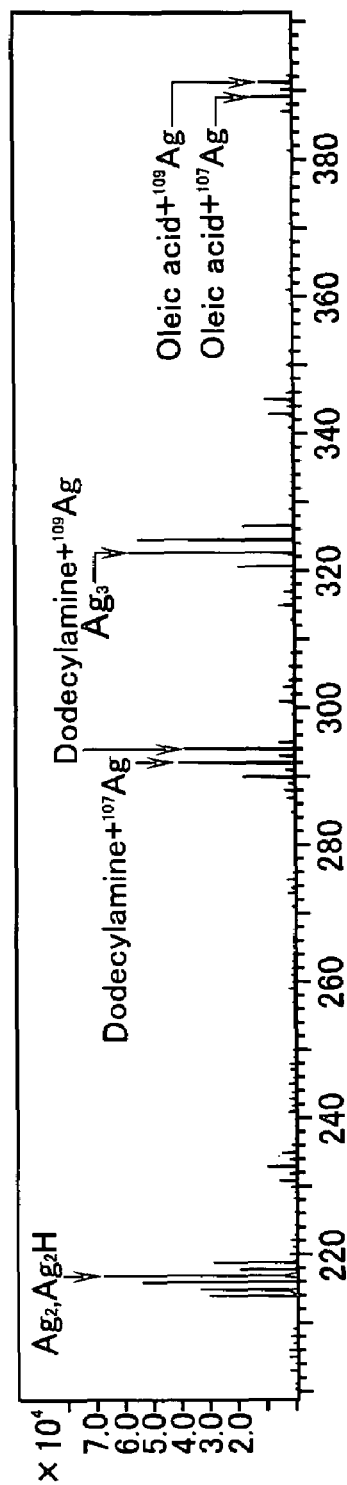
FIG. 1 is a graph showing the results of the TOF-SIMS analysis, observed for the silver nano-particles according to the present invention, which were prepared in Example 5.

The dispersion containing metal nano-particles according to the present invention has a considerably high metal concentration and accordingly, the dispersion of the invention would permit the reduction of the number of film-forming steps when preparing a conductive film and the formation of a film having a conductivity sufficient for putting the same to practical use even through a low temperature firing treatment. This metal nano-particle-containing dispersion can be used in the preparation of metal wires and the like in the fields of, for instance, display devices such as a flat panel display in the fields of electric and electronic industries; and in the field of metal wire-printing.

What is claimed is:

1. A method for the preparation of metal nano-particles comprising the steps of dissolving, in a non-polar solvent, one of an organic metal compound of a fatty acid, a metal complex of an amine wherein the amine is an aliphatic amine having a linear or branched structure or a mixture of the organic metal compound and the metal complex, and adding a reducing agent to the resulting liquid in order to reduce the liquid to thus give metal nano-particles, additionally while adding the reducing agent introducing, into the liquid, hydrogen gas, carbon monoxide gas, a hydrogen-containing gas or a carbon monoxide-containing gas, after the adding the reducing agent, adding deionized water to the liquid, followed by stirring the resulting mixture and then allowing the mixture to stand so that impurities present in the liquid are transferred to a polar solvent and that the impurity concentration in the non-polar solvent is reduced.

2. The method for the preparation of metal nano-particles as set forth in claim 1, wherein the size of the metal nano-particles is not less than 1 nm and not more than 100 nm.

3. The method for the preparation of metal nano-particles as set forth in claim 1, further including the steps of concentrating the mixture containing the metal nano-particles and then re-dispersing the metal nano-particles, to thus control a concentration thereof to a level of not less than 5% by mass and not more than 90% by mass.

4. The method for the preparation of metal nano-particles as set forth in claim 1, wherein the organic metal compound is adhered to the periphery of each metal nano-particle as a dispersant, and wherein the organic metal compound is an organic metal compound of a fatty acid, a metal complex of an amine or a mixture of an organic metal compound of a fatty acid and a metal complex of the amine.

5. The method for the preparation of metal nano-particles as set forth in claim 4, wherein the fatty acid is at least one member selected from the group consisting of $C_6$ to $C_{22}$ saturated fatty acids and unsaturated fatty acids, each having a linear or branched structure.

6. The method for the preparation of metal nano-particles as set forth in claim 4, wherein the fatty acid is at least one fatty acid selected from the group consisting of hexanoic acid, heptanoic acid, octanoic acid, nonanoic acid, decanoic acid, undecanoic acid, dodecanoic acid, tetra-decanoic acid, eicosanoic acid, docosanoic acid, 2-ethyl hexanoic acid, oleic acid, linoleic acid and linolenic acid.

7. The method for the preparation of metal nano-particles as set forth in claim 4, wherein the amine is an aliphatic amine having a linear or branched structure.

8. The method for the preparation of metal nano-particles as set forth in claim 7, wherein the amine is at least one member selected from the group consisting of hexylamine, heptylamine, octylamine, decylamine, dodecylamine, 2-ethyl-hexylamine, 1,3-dimethyl-n-butylamine, 1-aminoundecane and 1-amino tridecane.

9. A method for the preparation of a metallic wire or a metal film comprising the steps of coating, onto the surface of a base material a dispersion containing metal nano-particles prepared by dissolving, in a non-polar solvent, an organic metal compound of a fatty acid wherein the fatty acid is at least one member selected from the group consisting of $C_6$ to $C_{22}$ saturated fatty acids and unsaturated fatty acids, each having a linear or branched structure, a metal complex of an amine wherein the amine is an aliphatic amine having a linear or branched structure or a mixture of the organic metal compound and the metal complex, and adding a reducing agent to the resulting liquid in order to reduce the liquid to thus give metal nano-particles, additionally while adding the reducing agent introducing, into the liquid, hydrogen gas, carbon monoxide gas, a hydrogen-containing gas or a carbon monoxide-containing gas, after the adding the reducing agent, adding deionized water to the liquid, followed by stirring the resulting mixture and then allowing the mixture to stand so that impurities present in the liquid are transferred to a polar solvent and that the impurity concentration in the non-polar solvent is reduced, followed by drying and then firing the coated layer of the dispersion to thus form a thin metallic wire or a metal film having conductivity.

10. The method for the preparation of a metallic wire or a metal film as set forth in claim 9, wherein the temperature of the firing step ranges from 140 to 300°.

11. A metallic wire prepared according to the method as set forth in claim 9.

12. A metal film prepared according to the method as set forth in claim 9.

13. A method for the preparation of a metallic wire or a metal film comprising the steps of:

coating, onto the surface of a base material, a dispersion prepared by a method comprising the steps of:

dissolving, in a non-polar solvent, one of an organic metal compound of a fatty acid wherein the fatty acid is at least one member selected from the group consisting of $C_6$ to $C_{22}$ saturated fatty acids and unsaturated fatty acids, each having a linear or branched structure, a metal complex of an amine wherein the amine is an aliphatic amine having a linear or branched structure, or a mixture of the organic metal compound and the metal complex;

adding a reducing agent to the resulting liquid in order to reduce the liquid to thus give metal nano-particles and then re-dispersing the metal nano-particles, to thus control a concentration thereof to a level of not less than 5% by mass and not more than 90% by mass;

additionally while adding the reducing agent introducing, into the liquid, hydrogen gas, carbon monoxide gas, a hydrogen-containing gas or a carbon monoxide-containing gas; and after the adding the reducing agent, adding deionized water to the liquid, followed by stirring the resulting mixture and then allowing the mixture to stand so that impurities present in the liquid are transferred to a polar solvent and that the impurity concentration in the non-polar solvent is reduced;

drying and then firing the coated layer of the dispersion to thus form a thin metallic wire or a metal film having conductivity.

14. The method for the preparation of a metallic wire or a metal film as set forth in claim 13, wherein the temperature of the firing step ranges from 140 to 300°.

15. A metallic wire prepared according to the method as set forth in claim 13.

16. A metal film prepared according to the method as set forth in claim 13.

* * * * *